(12) United States Patent
Shibata

(10) Patent No.: US 6,627,981 B2
(45) Date of Patent: Sep. 30, 2003

(54) RESIN-PACKAGED SEMICONDUCTOR DEVICE

(75) Inventor: Kazutaka Shibata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 207 days.

(21) Appl. No.: 09/845,159

(22) Filed: May 1, 2001

(65) Prior Publication Data
US 2001/0035569 A1 Nov. 1, 2001

(30) Foreign Application Priority Data
May 1, 2000 (JP) .................................. 2000-132499

(51) Int. Cl.⁷ ............................................... H01L 23/02
(52) U.S. Cl. ...................... 257/678; 257/667; 257/702; 257/706; 257/717; 257/730; 257/735; 361/704; 361/709
(58) Field of Search .............................. 257/667, 702, 257/706, 717, 730, 735, 779, 783, 787, 788; 361/704, 709

(56) References Cited

U.S. PATENT DOCUMENTS 5,438,478 A * 8/1995 Kondo et al. ............... 174/260
5,440,169 A * 8/1995 Tomita et al. .............. 257/667
5,780,931 A * 7/1998 Shimoda et al. ............ 257/735
6,166,433 A * 12/2000 Takashima et al. ......... 257/693

* cited by examiner

Primary Examiner—David Nelms
Assistant Examiner—Mai-Huong Tran
(74) Attorney, Agent, or Firm—Arent Fox Kintner Plotkin & Kahn

(57) ABSTRACT

A plurality of leads are arrayed around an island (1) to which a semiconductor chip (3) is bonded. A plurality of first wires (4) interconnects each electrode terminal of the semiconductor chip (3) and each of the plurality of leads (2), while a second wire (4b) electrically connects a ground terminal of the semiconductor chip (3) with the island (1). This island (1) is so formed that a slit (1c) may be interposed between a wire bonding portion (1b) and a die pad portion (1a). In this configuration, the island and the leads are covered by a resin package (6) in such a manner that their back faces may be exposed from this package. As a result, even in a QFN type resin-packaged semiconductor device in which the back faces of the island and the leads are exposed for direct soldering at the time of mounting, the wire bonded to the island can be prevented from being disconnected or cut off, thus making that resin-packaged semiconductor device more stable in quality.

7 Claims, 3 Drawing Sheets

RESIN-PACKAGED SEMICONDUCTOR DEVICE

FIELD OF THE INVENTION

The present invention relates to a resin-packaged semiconductor device having a construction that the back faces of an island and each lead are exposed from a resin package so as to permit the semiconductor device to be directly mounted to a printed circuit board through the back face of each lead. More particularly, it relates to a resin-packaged semiconductor device having a construction that ground terminal of semiconductor chip is connected to the island by wire bonding so as to permit the semiconductor to be soldered to, for example, a printed circuit board with its island used as a ground lead.

BACKGROUND OF THE INVENTION

For example, a QFN (Quad Flat Non Lead) type package is known for a resin-packaged semiconductor device with a construction that the back faces of its island and each lead are exposed from the resin package so as to permit the semiconductor device to be directly mounted to a printed circuit board and the like through the back face of each lead. A semiconductor device 10 having such a construction comprises, for example as its explanatory cross-sectional view is shown in FIG. 4, an island 1 for bonding a semiconductor chip 3 thereon by use of an adhesive agent 5 such as silver paste and a plurality of leads 2 arrayed around the island 1 in such a configuration that each electrode terminal of the semiconductor chip 3 is wire-bonded in electrical connection to the corresponding one of the plurality of leads 2 by use of a wire 4 made of metal and the like. Then, the front face side, which is the side on which the semiconductor chip 3 has undergone die bonding and wire bonding is molded with a resin, thus forming a resin package 6.

In the construction shown in FIG. 4, the ground terminal of the semiconductor chip 3 can be wire-bonded with the island 1 through a second wire 4b to thereby permit the device to be connected to a printed circuit board with the island 1 used as a ground lead. Each lead 2, the back face of which is to be directly connected to the printed circuit board and the like, need not to be formed as extended from the resin package 6, thus providing a so-called lead-less construction. As shown in FIG. 5, thus constructed semiconductor device 10 can be directly soldered through solder reflow and thereby mounted to, e.g. a printed circuit board 7 with a wiring pattern 8 formed thereon.

As mentioned above, a resin-packaged semiconductor device having such a construction typified by a QFN type package that the back faces of its island and each lead are exposed from the package so as to permit the device to be directly soldered to a printed circuit board or the like which having no lead extending to the outside, so that advantageously it can be small and easily mounted as well as readily radiate externally the heat produced during its operation, thus improving the reliabilities. Disadvantageously, however, when the device is mounted to the printed circuit board and the like, the island readily rises during solder reflow up to a soldering temperature, accompanied by a rapid rise in temperature of the overlying resin package. Problematically, this rapid rise in temperature of the island and the overlying resin causes expansion of the water contents contained in their interface and resin and also partial vapor explosion, thus giving rise to separation between the island and the resin as well as disconnection or cut-off of the second wire bonded to the island as shown as A in FIG. 4.

SUMMARY OF THE INVENTION

In view of the above, it is an object of the present invention to provide a stable-quality resin-packaged semiconductor device of such a type typified by a QFN type package that the back faces of its island and each lead are exposed to thereby permit the device to be, for example, soldered directly through these back faces and mounted to a printed circuit board and the like, in which the wire bonded to the island persistently cannot easily be disconnected or cut off.

A semiconductor device of a QFN type package and the like, when mounted to a printed circuit board and the like, may encounter an accident of disconnection or cutoff of the bonding portion of the second wire bonded to the island, the causes of which were investigated and discussed greatly by the inventor, who eventually found that local vapor explosion occurs due to a soldering temperature during solder reflow at the time of mounting, which leads to a separation force acting particularly on the interface between the island having a large area and hence a large thermal capacity and the overlying resin package which is roughly only in plane contact with it. The inventor found also that to guard against it, by forming a gap between the wire bonding portion on the island and the die pad portion to thereby cover only the wire bonding portion with a resin in configuration, a separation force would not act on the wire bonding portion so much, thus preventing disconnection and cut-off of the wire.

That is, an ordinary type of a resin-packaged semiconductor device may encounter wire disconnection due to a contraction force when a molding resin filled at a high temperature to package the device is cooled caused by a difference in expansion coefficient between the resin to be molded and the island, whereas device such as a QFN type-packaged semiconductor would not encounter wire disconnection due to stress during molding even with the difference in thermal expansion coefficient between a lead frame and the resin, in which leads are arrayed around the island supported at four corners in the lead frame, i.e. in a central symmetrical configuration.

However, the inventor found such a phenomenon that in the case of a QFN type package wherein the back faces, subject to soldering, of the island and each lead are exposed directly from the package, particularly when the ground terminal is wire-bonded to that island, the island is also soldered during mounting, so that it rises in temperature due to the heat of soldering to thereby cause a separation force to act on the interface between the island and the overlying resin, thus readily disconnecting or cutting off the wire bonded. That is, this phenomenon is peculiar to such a type of semiconductor device that it is directly soldered through the exposed back faces of the island and leads.

A resin-packaged semiconductor device according to the present invention comprises; an island for bonding a semiconductor chip to its front face side, a plurality of leads arrayed at least partially around the island, a plurality of first wires for electrically interconnecting each electrode terminal of the semiconductor chip to the respectively corresponding plurality of leads, a second wire for electrically interconnecting a ground terminal of the semiconductor chip and the island, and a resin package for exposing thereof the back faces of the island and leads and also covering the front face side, in such a configuration that the island is formed in such a manner that a gap may be interposed between the wire bonding portion to which the second wire is bonded and the die pad portion to which the semiconductor chip is bonded.

Here, the front face side and the back face side refer to a side of the island or the lead on which the semiconductor chip or the wire is bonded and its opposite side, respectively.

By employing such a construction, even if separation develops between the island and the overlying resin, the separation force does not so much act on the wire bonding portion, because it is sandwiched between the resin filled in the gap and the resin filled around the island, and tightly adhered to the resin, so that the wire is not readily disconnected or cut off. This results in obtaining a highly reliable semiconductor device.

The gap interposed between the wire bonding portion and die pad portion may be formed in a slit provided therebetween or formed at a non-linking position when the above-mentioned wire bonding portion is linked to the die pad portion in a bridge state.

By providing such a construction that the wire bonding portion is formed so as to be positioned on the upper side than the die pad and that the back face side of the die pad portion of the island and the back face side of the plurality of leads may be exposed from the resin package roughly in the same plane and also that the back face side of the wire bonding portion is also contained in the resin package, the wire bonding portion does not come in direct contact with a printed circuit board and the like to thereby suppress the conduction of heat due to a rise in temperature caused by solder reflow during mounting and also prevent a separation force from developing between the island's wire bonding portion and the resin because the surroundings are covered by the resin, thus avoiding the disconnection or cut-off of the wire bonded.

DETAILED DESCRIPTION

Figure 1:
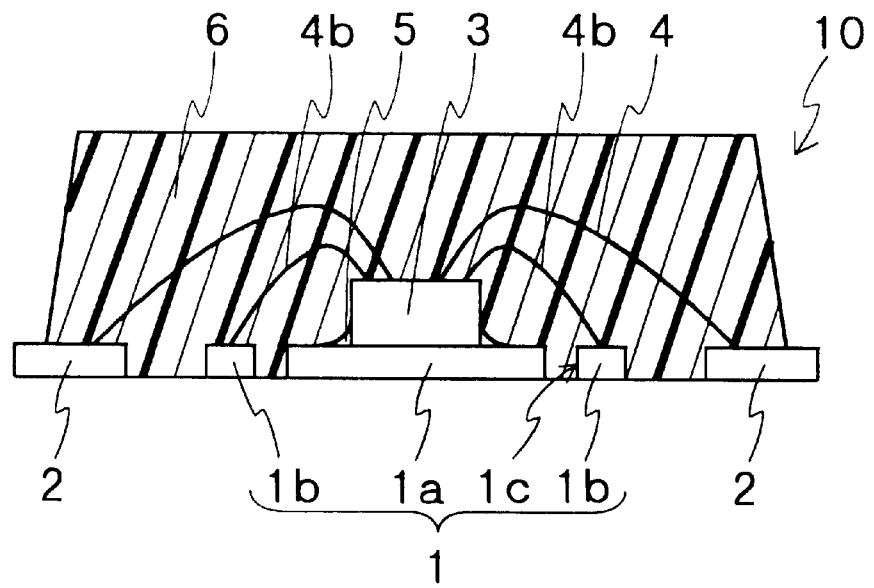
FIGS. 1(a) and 1(b) are respectively a cross-sectional view for showing one embodiment of a resin-packaged semiconductor device according to the present invention and a plan view for showing the device with the upper part of the package as removed.
Figure 1:
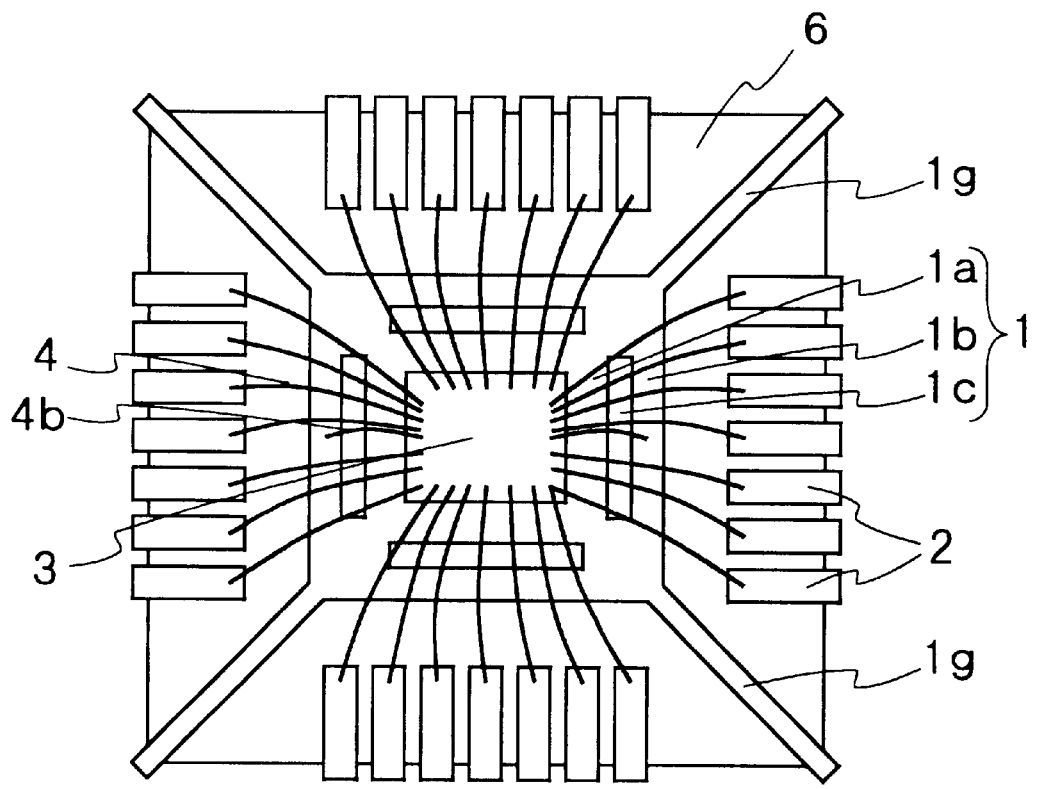

As shown in FIGS. 1(a) and 1(b) for respectively illustrating an explanatory cross-sectional view of QFN type resin-packaged semiconductor device according to one embodiment of the present invention and a plan view of the device with the upper part of the package as removed, a plurality of leads 2 is arrayed at least partially around an island 1. On the front face side of the island 1 is bonded a semiconductor chip 3. Each electrode terminals of this semiconductor chip 3 and the plurality of leads 2 are correspondingly interconnected electrically by a plurality of first wires 4. Also, the ground terminal of the semiconductor chip 3 is electrically connected to the island 1 by a second wire 4b to thereby provide the island 1 with a function of the ground lead in such a configuration according to the present invention that the island 1 is so formed as to have a gap 1c interposed between a wire bonding portion 1b at which the second wire 4b is bonded and a die pad portion 1a at which the semiconductor chip 3 is die-bonded. Also, the island 1 and the leads 2 are covered by a resin package 6 on their front face sides so that their back face sides may be exposed from the package.

The island 1 and the leads 2 are formed in a lead frame similarly to the case of the prior art semiconductor device, so that after the semiconductor chip 3 has undergone die bonding and wire bonding and has been packaged by a resin, a support bar 1g for supporting the leads 2 and the island 1 is cut off from the lead frame to thus form a shape shown in FIGS. 1(a) and 1(b) for a semiconductor device. In the semiconductor device according to the present invention, as shown in an explanatory plan view of FIG. 1(b) for showing a state where the upper part of the resin package 6 is removed, as a feature of the present invention, the island 1 is formed such that the die pad portion 1a for bonding the semiconductor chip 3 and the wire bonding portion 1b for wire-bonding the ground terminal may be integrally formed electrically yet with a gap (e.g., slit 1c) interposed therebetween.

In an example shown in FIG. 1(b), the slit 1c is formed in each of the four sides of the square-shaped island 1 to thereby form a gap between the die pad portion 1a and the wire bonding portion 1b. Although this case has the slit 1c in each of the four sides, of course, the slit 1c may be formed only in the side for wire bonding. This slit 1c only needs to have a width enough for a resin to come in to such an extent that the separation force of the die pad portion 1a may not reach the wire bonding portion 1b, e.g. roughly a few tenths of millimeters. Also, the wire bonding portion 1b only needs to be formed wide enough for wire bonding.

Figure 2:
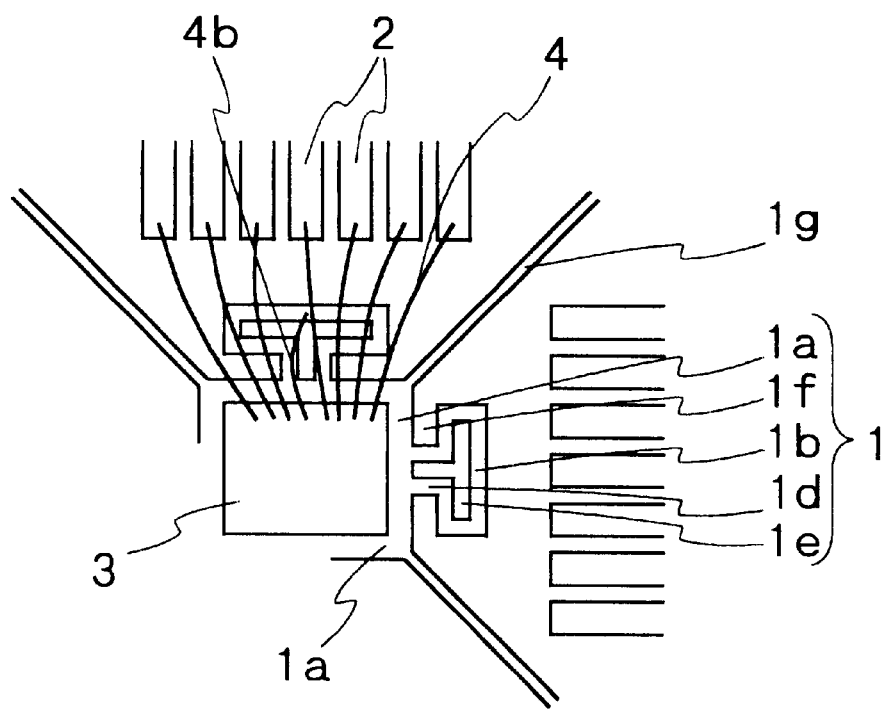
FIG. 2 is an explanatory plan view for showing a variant of a wire bonding portion of an island.

The gap may be formed in another example as shown in FIG. 2 for showing part of the contents of FIG. 1(b), in which the wire bonding portion 1b is formed via a bridge-shaped linkage portion 1d in the side of the die pad portion 1a. In the example shown in FIG. 2, a through hole 1e is formed in the bridge-shaped linkage portion id and the wire bonding portion 1b, the through hole is formed a gap between themselves and the die pad portion 1a. By forming such a bridge-shaped linkage portion 1d, however, a gap 1f outside the linkage portion id is formed between the die pad portion 1a and the wire bonding portion 1b, so that the linkage portion id can be formed narrow to thereby form the gap sufficiently between the die pad portion and the wire bonding portion. In FIG. 2, the same parts are indicated by the same reference signs as those in FIG. 1(b) and so their explanation is omitted here.

The support bar 1g is linked to the island 1 at its four corners for supporting it as put on the lead frame and, after the package 6 is formed by use of a resin, is cut off from the lead frame. The semiconductor chip 3 comprises an IC (LSI) chip in which various circuits are integrated on an ordinary silicon substrate etc. and undergoes wire bonding by use of a gold wires like in the case of the manufacture of prior art semiconductor. The resin package 6 is made by transfer molding of an epoxy resin into which a black filler is mixed like in the case of the manufacture of the usual ICs. The present invention employs such a QFN type package construction that during this molding, the back faces of at least part of the island and each lead may not be covered by the resin package 6 and so exposed therefrom so as to be directly soldered to a printed circuit board etc.

By the present invention, since the island's wire bonding portion is formed so as to form a gap between itself and the die pad portion, the back faces of the island and the lead are exposed from the QFN type package, so that during direct mounting of the relevant device to a printed circuit board etc. through those exposed portions, a separation force, if any due to a high temperature during soldering of the island, between the island and the resin package has no effects on the wire bonding portion. As a result, such an accident as disconnection or cut-off of the wire-bonded wire hardly occurs. Also, even if there occurs any separation force between the island and the resin package caused by a high temperature during soldering for mounting, the die hardly rises to such a high temperature after it is soldered, with little future possibility of the separation force deteriorating the reliability of the semiconductor device. If, on the other hand, the island is already soldered to the ground wiring of the mounting board and therefore the temperature of the semiconductor chip rises due to the operations of the device, the resultant heat can be readily radiated through the island and the wiring patterns on the mounting board, thus greatly improving the heat resistant reliability.

Figure 3:
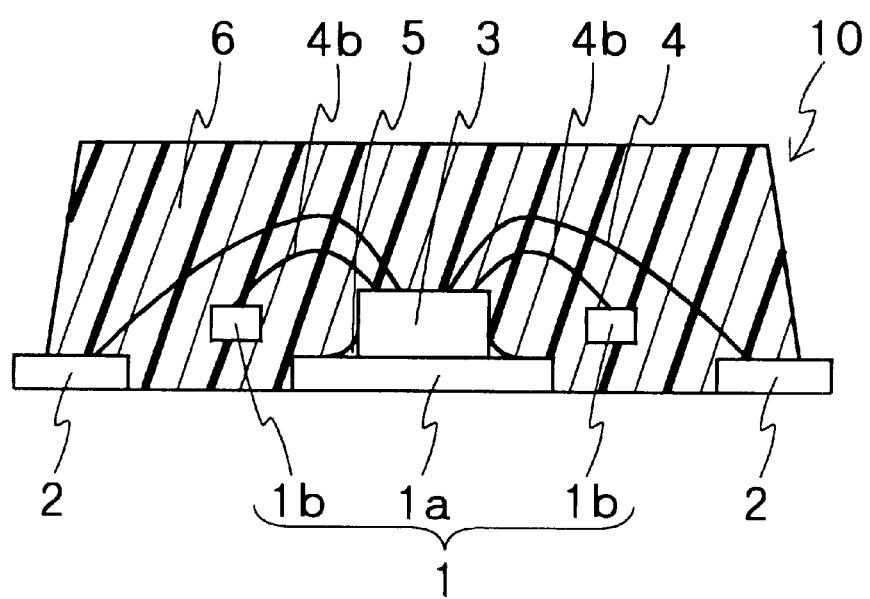
FIG. 3 is an explanatory cross-sectional view for showing another embodiment of the resin-packaged semiconductor device according to the present invention.
Figure 4:
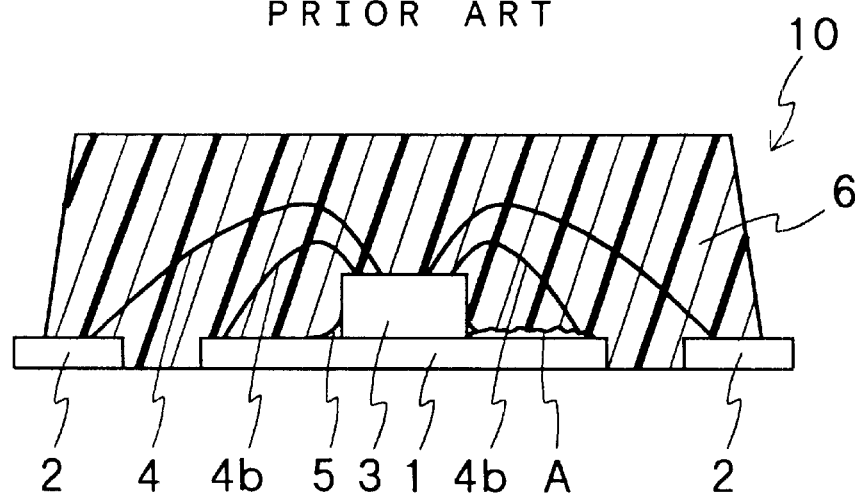
FIG. 4 is an explanatory cross-sectional view for showing a prior art QFN type-packaged semiconductor device.
Figure 5:
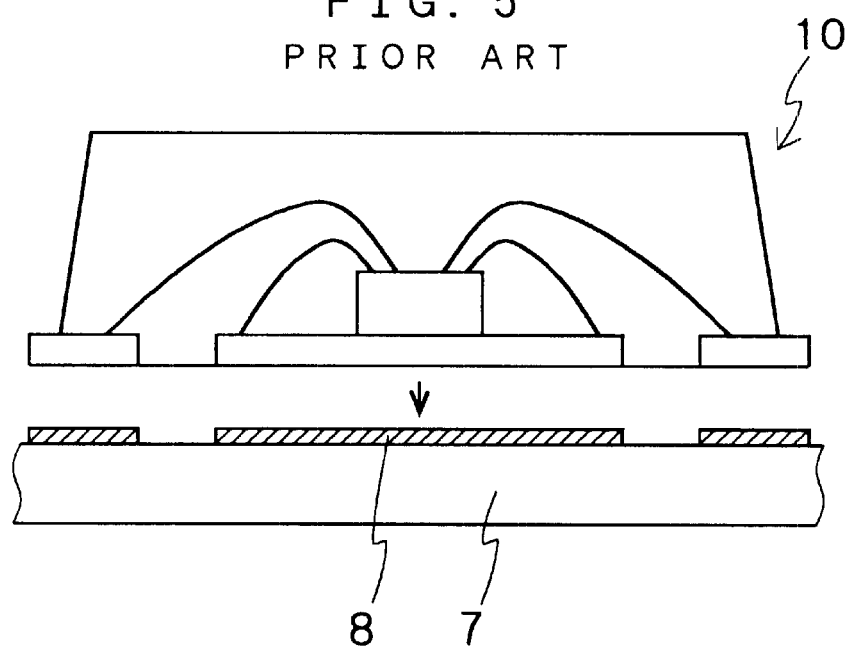
FIG. 5 is an explanatory cross-sectional view for showing a state where the semiconductor device of FIG. 4 is mounted to a printed circuit board.

FIG. 3 is an explanatory cross-sectional view like FIG. 1(a) for showing another embodiment of the resin-packaged semiconductor device according to the present invention. That is, in this embodiment, the wire bonding portion 1b of the island 1 is formed higher in level (on the upper side) than the die pad portion 1a, i.e. shifted up to the front face side in shape. To provide such a shape, on the lead frame, a step is formed by forming at a portion for linking the die pad portion 1a and the wire bonding portion 1b and at the support bar Ig for supporting the island to thereby elevate only the wire bonding portion 1b. Thus formed shape enables completely covering the surroundings of the wire bonding portion 1b with a resin, to even further suppress a separation force from acting on the wire bonded portion and also prevent direct contacting with a soldering portion on the mounting board also during solder reflow at the time of mounting, so that a rise in temperature and hence vapor explosion can be suppressed, thus even further preventing such an accident as wire cut-off.

As described above, by the present invention, also in a QFN type-packaged semiconductor device in which the back faces of the island and the lead are exposed from the package for direct soldering, even at a high temperature due to that soldering for mounting, no separation force acts on the wire bonding portion, to thereby improve the wire bonding reliability. As a result, it is possible to obtain a resin-packaged semiconductor device excellent in reliability.

Although preferred examples have been described in some detail it is to be understood that certain changes can be made by those skilled in the art without departing from the spirit and scope of the invention as defined by the appended claims.

What is claimed is:

1. A resin-packaged semiconductor device comprising:
   an island for bonding a semiconductor chip to a front face side thereof, said island being formed in a lead frame;
   a plurality of leads arrayed at least partially around said island, said plurality of leads being formed in said lead frame;
   a plurality of first wires for electrically interconnecting each electrode terminal of said semiconductor chip and the corresponding one of said plurality of leads;
   a second wire for electrically connecting a ground terminal of said semiconductor chip to said island; and
   a resin package for exposing back faces of said island and said leads therefrom and covering said front face side,
   wherein said island is formed in such a manner that a gap is interposed between a wire bonding portion for bonding said second wire and a die pad portion for bonding said semiconductor chip.

2. The resin-packaged semiconductor device of claim 1, wherein said gap is formed as a slit interposed between said wire bonding portion and said die pad portion.

3. The semiconductor device of claim 2, wherein said island is formed in a square shape such that said slit is formed in each of the four sides of the square.

4. The resin-packaged semiconductor device of claim 1, wherein said wire bonding portion is linked with said die pad portion in a bridge shape, thus forming said gap beside the linkage portion between said wire bonding portion and said die pad portion.

5. The semiconductor device of claim 4, wherein a through hole is formed in said wire bonding portion linked in a bridge shape with said die pad portion.

6. The resin-packaged semiconductor device of claim 1, wherein:
   said wire bonding portion is formed so as to be positioned on the upper side than said die pad portion;
   a back face of said die pad portion of said island and back faces of said plurality of leads are exposed from said resin package in the substantially same plane; and
   a back face of said wire bonding portion is contained in said resin package.

7. The semiconductor device of claim 1, wherein a plurality of lead arrayed around said island are toward perpendicular to four sides of a square of said island.

* * * * *